(12) United States Patent
Reid et al.

(10) Patent No.: US 10,586,924 B2
(45) Date of Patent: Mar. 10, 2020

(54) CEM SWITCHING DEVICE

(71) Applicant: ARM Ltd., Cambridge (GB)

(72) Inventors: Kimberly Gay Reid, Austin, TX (US); Lucian Shifren, San Jose, CA (US); Carlos Alberto Paz de Araujo, Colorado Springs, CO (US); Jolanta Celinska, Mountlake Terrace, WA (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/243,668

(22) Filed: Aug. 22, 2016

(65) Prior Publication Data

US 2018/0053892 A1 Feb. 22, 2018

(51) Int. Cl.
*H01L 45/00* (2006.01)
*H01L 49/00* (2006.01)

(52) U.S. Cl.
CPC ............ *H01L 49/003* (2013.01); *H01L 45/04* (2013.01); *H01L 45/1233* (2013.01); *H01L 45/146* (2013.01); *H01L 45/16* (2013.01); *H01L 45/1658* (2013.01)

(58) Field of Classification Search
CPC ............... H01L 49/003; H01L 45/1233; H01L 45/1658
See application file for complete search history.

(56) References Cited

U.S. PATENT DOCUMENTS

| | | | |
|---|---|---|---|
| 7,298,640 B2 | 11/2007 | Chen | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 9,558,819 B1 | 1/2017 | Aitken et al. | |
| 9,584,118 B1 | 2/2017 | Dao et al. | |
| 9,589,636 B1 | 3/2017 | Bhavnagarwala et al. | |
| 9,627,615 B1 | 4/2017 | Reid et al. | |
| 2003/0180445 A1* | 9/2003 | Wang ..................... C23C 4/02 427/58 |
| 2008/0106926 A1* | 5/2008 | Brubaker ............ H01L 27/2409 365/148 |
| 2008/0107801 A1 | 5/2008 | Celinska et al. | |
| 2010/0102289 A1 | 4/2010 | Dimitrov et al. | |
| 2012/0074372 A1 | 3/2012 | Yang et al. | |

(Continued)

FOREIGN PATENT DOCUMENTS

| EP | 1786046 A3 | 5/2007 |
|---|---|---|
| WO | 2013012423 A1 | 1/2013 |
| WO | 2017141042 A1 | 8/2017 |

OTHER PUBLICATIONS

Notification of Transmittal of The International Search Report and the Written Opinion of the International Searching Authority, or the Declaration, International Application No. PCT/GB2017/052307, dated Oct. 4, 2017, 1 pg.
The International Search Report, International Application No. PCT/GB2017/052307, dated Oct. 4, 2017, 6 pgs.
The Written Opinion of the International Searching Authority, International Application No. PCT/GB2017/052307, dated Oct. 4, 2017, 14 pgs.

(Continued)

*Primary Examiner* — Thomas L Dickey
(74) *Attorney, Agent, or Firm* — Berkeley Law & Technology Group, LLP

(57) ABSTRACT

Subject matter herein disclosed relates to a method for the manufacture of a switching device comprising a correlated electron material. In embodiments, processes are described which may be useful for avoiding a resistive layer which tends to form between the correlated electron material and a conductive substrate and/or overlay.

10 Claims, 7 Drawing Sheets

(56) References Cited

U.S. PATENT DOCUMENTS

| | | | |
|---|---|---|---|
| 2012/0295398 A1* | 11/2012 | Kurunczi | H01L 45/165 |
| | | | 438/104 |
| 2013/0200323 A1 | 8/2013 | Pham et al. | |
| 2013/0214232 A1 | 8/2013 | Tendulkar | |
| 2013/0285699 A1 | 10/2013 | McWilliams et al. | |
| 2015/0041751 A1* | 2/2015 | Zhang | H01L 29/47 |
| | | | 257/4 |
| 2016/0163978 A1 | 6/2016 | Paz De Araujo et al. | |
| 2017/0033782 A1 | 2/2017 | Shifren et al. | |
| 2017/0045905 A1 | 2/2017 | Sandhu et al. | |
| 2017/0047116 A1 | 2/2017 | Sandhu et al. | |
| 2017/0047919 A1 | 2/2017 | Sandhu et al. | |
| 2017/0069378 A1 | 3/2017 | Shifren et al. | |

OTHER PUBLICATIONS

Celinska et. al., "Operating Current Reduction in Nickel Oxide Correlated Electron Random Access Memories (CeRams) Through Controlled Fabrication Processes", vol. 124, No. 1, Jan. 1, 2011, pp. 105-111.

Notification Concerning Transmittal of International Preliminary Report on Patentability, App. No. PCT/GB2017/052307, Filed Aug. 4, 2017, dated Mar. 7, 2019, 1 Page.

International Preliminary Report on Patentability, App. No. PCT/GB2017/052307, Filed Aug. 4, 2017, dated Mar. 7, 2019, 1 Page.

Written Opinion of the International Searching Authority, App. No. PCT/GB2017/052307, Filed Aug. 4, 2017, dated Mar. 7, 2019, 11 Pages.

\* cited by examiner

Form a conductive substrate by depositing a layer or layers of a doped conducting material Or Form a conductive substrate by depositing a layer or layers of a conducting material followed by depositing a layer or layers of a doped conducting material Or Form a conductive substrate by depositing a layer or layers of a conducting material followed by treating the deposited layer or layers to incorporate dopant And Optionally anneal the conductive substrate to remove impurities and/or to modify the distribution of dopant And Form a primary layer by depositing a layer or layers of a correlated electron material on the conductive substrate and obtain a secondary layer of a correlated electron material between the conductive substrate and the primary layer And Optionally, anneal the conductive substrate and the primary layer to remove impurities and/or to modify the distribution of dopant in the primary and/or secondary layer

FIG. 4

Form a conductive substrate by depositing a layer or layers of a doped conducting material Or Form a conductive substrate by depositing a layer or layers of a conducting material followed by depositing a layer or layers of a doped conducting material Or Form a conductive substrate by depositing a layer or layers of a conducting material followed by treating the deposited layer or layers to incorporate dopant And Optionally anneal the conductive substrate to remove impurities and/or to modify the distribution of dopant And Form a primary layer by depositing a layer or layers of a correlated electron material on the conductive substrate and obtain a secondary layer of a correlated electron material between the conductive substrate and the primary layer And Optionally, anneal the conductive substrate and the primary layer to remove impurities and/or to modify the distribution of dopant in the primary and/or secondary layer

FIG. 5

CEM SWITCHING DEVICE

This disclosure relates to a switching device comprising a correlated electron material (CEM) and to methods for the manufacture of the switching device.

Electronic switching devices are found in a wide variety of electronic device types, such as computers, digital cameras, cellular telephones, tablet devices, personal digital assistants and so forth, where they may function as memory and/or logic devices.

Factors of interest to a designer in considering whether a particular electronic switching device is suitable for such a function, may include physical size, storage density, operating voltages, impedance ranges, and/or power consumption. Other factors of interest may include cost of manufacture, ease of manufacture, scalability and/or reliability.

There appears to be an ever-increasing drive towards memory and/or logic devices exhibiting lower power and/or higher speed. Switching devices comprising a CEM are at the forefront of this drive not just because they can exhibit low power and/or high speed but also because they are generally reliable and easily and cheaply manufactured.

The present disclosure describes methods for the manufacture of an improved switching device based upon a CEM. The CEM switching device may, for example, find application as a correlated electron random access memory (CE-RAM) in memory and/or logic devices which may be used with a wide range of electronic circuit types, such as memory controllers, memory arrays, filter circuits, data converters, optical instruments, phase locked loop circuits, microwave and millimeter wave transceivers, and so forth.

A CEM switching device can exhibit a rapid conductor-to-insulator transition as compared to other switching devices because the switching is brought about by an electron correlation rather than by a solid state structural phase change or by formation of filaments, as is found respectively in phase change memory devices and resistive RAM devices.

The rapid conductor-to-insulator transition of a CEM switching device may, in particular, be responsive to a quantum mechanical phenomenon in contrast to the melting/solidification or filament formation found respectively in phase change and resistive RAM devices. The quantum mechanical transition in a CEM switching device between a relatively conductive state and a relatively insulative state (or between a first impedance state and a second impedance state) may occur in several ways.

In one respect, a quantum mechanical transition of a CEM between a relatively insulative/higher impedance state and a relatively conductive/lower impedance state may be understood in terms of a Mott transition. In accordance with a Mott transition, a material may switch from a relatively insulative/higher impedance state to a relatively conductive/lower impedance state if a Mott transition condition is satisfied. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state).

In another respect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

The switching from a relatively insulative/higher impedance state to a relatively conductive/lower impedance state may bring about a change in capacitance in addition to a change in resistance. For example, a CEM switch may exhibit a variable resistance together with a property of variable capacitance. In other words, impedance characteristics of a CEM switch may include both resistive and capacitive components. For example, in a metal state, a CEM switch may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a relatively conductive/lower impedance state in a CEM switch may result in changes in both resistance and capacitance.

A switching device formed from a CEM may exhibit switching of impedance states responsive to a Mott-transition in a majority of the volume of the CEM comprising the device. The CEM may, in particular, form a "bulk switch". As used herein, the term "bulk switch" refers to at least a majority volume of a CEM switching a device's impedance state, such as in response to a Mott-transition. For example, substantially all CEM of a device may switch from a relatively insulative/higher impedance state to a relatively conductive/lower impedance state or from a relatively conductive/lower impedance state to a relatively insulative/higher impedance state responsive to a Mott-transition.

In one arrangement, shown in FIG. 1, a CEM switching device may comprise a CEM layer sandwiched between a conductive substrate and a conductive overlay. In this arrangement, the CEM switching device can act as memory storage element. In other arrangements, the CEM switching device may comprise either a CEM layer provided on a conductive substrate or a CEM layer provided with a conductive overlay. In these other arrangements, the device comprises source and a drain regions providing for a flow of current across the device.

Referring now to FIG. 1A, a current density versus voltage profile 100 of a CEM switching device is shown which illustrates its switching behaviour. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may bring about a transition of the CEM switching device to a relatively low-impedance memory state. Conversely, application of a voltage $V_{reset}$ and a current density $J_{reset}$ reset may bring about a transition of the CEM device to a relatively high-impedance memory state.

As shown in FIG. 1A, reference designator 110 illustrates the voltage range that may separate $V_{set}$ from $V_{reset}$. Following placement of the CEM switching device into a high-impedance state or a low-impedance state, the particular state of the CEM switching device may be detected by application of a voltage $V_{read}$ (e.g., during a read operation) and detection of a current or current density at terminals of the CEM switching device (e.g., utilizing read window 107).

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM switching device may switch from a relatively low-impedance state to a relatively high-impedance state, for example, responsive to a Mott transition. This may correspond to point 108 of the voltage versus current density profile of FIG. 1A. At, or suitably nearby this point, electrons are no longer screened and become localized near the metal ion. This correlation may result in a strong electron-to-electron interaction potential which may operate to split the bands to form a relatively high-impedance material.

If the CEM switching device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain devices, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

The current in a CEM switching device may be controlled by an externally applied "compliance" condition, which may be determined at least partially on the basis of an applied external current, which may be limited during a write operation, for example, to place the CEM device into a relatively high-impedance state. This externally-applied compliance current may, in some devices, also set a condition of a current density for a subsequent reset operation to place the CEM device into a relatively high-impedance state. As shown in the particular device of FIG. 1A, a current density $J_{comp}$ may be applied during a write operation at point 116 to place the CEM switching device into a relatively high-impedance state, may determine a compliance condition for placing the CEM device into a low-impedance state in a subsequent write operation. As shown in FIG. 1A, the CEM device may be subsequently placed into a low-impedance state by application of a current density $J_{reset} \geq J_{comp}$ at a voltage $V_{reset}$ at point 108, at which $J_{comp}$ is externally applied.

The compliance may, in particular, set a number of electrons in a CEM switching device which may be "captured" by holes for the Mott transition. In other words, a current applied in a write operation to place a CEM device into a relatively low-impedance memory state may determine a number of holes to be injected to the CEM device for subsequently transitioning the CEM switching device to a relatively high-impedance memory state.

As pointed out above, a reset condition may occur in response to a Mott transition at point 108. Such a Mott transition may bring about a condition in the CEM switching device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \quad (1)$$
$$n = \left(\frac{C}{\lambda_{TF}}\right)^3$$

wherein $\lambda_{TF}$ corresponds to a Thomas Fermi screening length, and C is a constant.

A current or current density in region 104 of the voltage versus current density profile shown in FIG. 1A, may exist in response to injection of holes from a voltage signal applied across terminals of the CEM switching device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \quad (2)$$
$$Q(V_{MI}) = qn(V_{MI})$$

wherein $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$
$$J_{reset}(V_{MI}) = J_{MI}(V_{MI}) = \frac{I_{MI}(V_{MI})}{A_{CEM}} = \frac{q}{A_{CEM} t}\left(\frac{C}{\lambda_{TF}(V_{MI})}\right)^3$$

wherein $A_{CEM}$ is a cross-sectional area of a CEM switching device; and $J_{reset}(V_{MI})$ may represent a current density through the CEM switching device to be applied to the CEM switching device at a threshold voltage $V_{MI}$, which may place the CEM switching device into a relatively high-impedance state.

FIG. 1B shows a CEM switching device 150 comprising a CEM layer 160 sandwiched between a conductive substrate 170 and a conductive overlay 180 and a schematic diagram of an equivalent circuit for the switching device.

As previously mentioned, the CEM switching device may exhibit characteristics of both variable resistance and variable capacitance. In other words, the CEM switching device may be considered as a variable impedance device in which the impedance depends at least in part on resistance and capacitance characteristics of the device if measured across device terminals 190 and 190'. The equivalent circuit for a variable impedance device may comprise a variable resistor 192, such as variable resistor, in parallel with a variable capacitor 194. Of course, although a variable resistor and variable capacitor are depicted in FIG. 1B as comprising discrete components, the variable impedance device, such as that shown, may comprise a substantially homogenous CEM.

Table 1 below depicts an example truth table for an example variable impedance device, such as the device of FIG. 1A.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

Table 1 shows that a resistance of a variable impedance device, such as that shown, may transition between a low-impedance state and a substantially dissimilar, high-impedance state as a function at least partially dependent on a voltage applied across the CEM switching device. The impedance exhibited at a low-impedance state may, for example, be approximately in the range of 10.0-100,000.0 times lower than an impedance exhibited in a high-impedance state. However, the impedance exhibited at a low-impedance state may be approximately in the range of 5.0 to 10.0 times lower than an impedance exhibited in a high-impedance state. Table 1 also shows that a capacitance of a variable impedance device, such as the device shown, may transition between a lower capacitance state, which may, for example comprise an approximately zero, or very little, capacitance, and a higher capacitance state that is a function, at least in part, of a voltage applied across the CEM switching device.

The CEM switching device may be placed into a relatively low-impedance memory state, such as by transitioning from a relatively high-impedance state, for example, via injection of a sufficient quantity of electrons to satisfy a Mott transition criteria. In transitioning a CEM switching device to a relatively low-impedance state, if enough electrons are injected and the potential across the terminals of the CEM device overcomes a threshold switching potential (e.g., $V_{set}$), injected electrons may begin to screen. As previously mentioned, screening may operate to delocalize double-occupied electrons to collapse the band-splitting potential, thereby bringing about a relatively low-impedance state.

The CEM switching device may comprise a CEM layer comprising one or more transition metals or transition metal compounds, in particular, one more transition metal oxides (TMOs) or oxides comprising rare earth elements or oxides of a d or f-block element, or rare earth transitional metal oxide or perovskites of yttrium, and/or ytterbium. Further, the conductive substrate and/or the conductive overlay may comprise one or more of a metal or metal compound such as a metal oxide or nitride, a semiconductor or an alloy.

On occasion, therefore, an oxidation layer may form over conductive substrate during the formation of the conductive substrate and/or during subsequent processing. For example, if the CEM layer, deposited over the conductive substrate, utilizes a transition metal oxide, such as NiO, oxygen atoms from CEM layer may migrate or diffuse towards conductive substrate. At times, such oxygen migration may give rise to an interfacial layer, such as oxidation layer, which may introduce a resistance to an electric current flowing between the CEM layer and the conductive substrate.

Likewise, in at least some instances, after formation of the conductive overlay, an oxygen migration or diffusion from the CEM layer may bring about formation of an interfacial layer, such as an oxidation layer, which may introduce resistance to an electric current flowing between the CEM layer and the conductive overlay.

U.S. patent application Ser. No. 15/207,708 (incorporated herein by reference) discloses one approach to the problem of formation of such interfacial layers. This approach involves exposing the conductive substrate and/or conductive overlay to an agent which inhibits the formation of an oxide layer, for example, at the interfacial surface of the substrate.

The present disclosure discloses an approach which does not inhibit the formation of the interfacial layer but rather provides for doping of the interfacial layer. The doping may provide that the interfacial layer is formed as a CEM of relatively low resistance as compared to the interfacial layer which may otherwise be formed between the conductive substrate and/or conductive overlay and the CEM layer.

Accordingly, in a first aspect, the present disclosure provides a method for the manufacture of a switching device, which method comprises forming a conductive substrate and forming a primary layer of a correlated electron material on the conductive substrate wherein the forming of the conductive substrate comprises incorporating a dopant providing that the forming of the primary CEM layer leads to a secondary layer of a correlated electron material between the primary CEM layer and the conductive substrate.

The method may, in particular, comprise forming the conductive substrate by depositing a layer or layers of doped metal or metal compound. Alternatively, the method may comprise forming the conductive substrate by depositing a layer or layers of a metal or metal compound and treating the metal or metal compound layer or layers to incorporate a dopant. The method may also comprise annealing the metal or metal compound layer or layers prior to or after the forming of the primary CEM layer on the conductive substrate.

In a second aspect, the present disclosure provides a method for the manufacture of a switching device, which method comprises forming a primary layer of a correlated electron material on a conductive or other substrate and forming a conductive overlay on the primary CEM layer wherein the forming of the conductive overlay comprises incorporating a dopant providing a secondary layer of a correlated electron material between the primary CEM layer and the conductive overlay.

In this aspect, the method may, in particular, comprise forming the conductive overlay on the primary CEM layer by depositing a layer of a doped metal or metal compound. Alternatively, the method may comprise forming the conductive overlay on the primary CEM layer by depositing a layer of a metal or metal compound and treating the layer to incorporate a dopant. The method may also comprise annealing the doped metal or metal compound layer or layers after the forming of the conductive overlay on the primary CEM layer.

In a third aspect, the present disclosure provides a method for the manufacture of a switching device, which method comprises forming a conductive substrate, forming a primary layer of a correlated electron material on the conductive substrate and forming a conductive overlay on the primary CEM layer wherein the forming of the conductive substrate and the conductive overlay comprises incorporating a dopant providing a secondary layer of a correlated electron material between the primary CEM layer and the conductive substrate and a secondary layer of correlated electron material between the primary CEM layer and the conductive overlay.

In each aspect, the method may comprise forming the conductive substrate and/or conductive overlay by depositing one or more layer or layers of titanium nitride, tantalum nitride, tungsten nitride, platinum, titanium, copper, aluminum, cobalt, nickel, tungsten, tungsten nitride, cobalt silicide, ruthenium, ruthenium oxide, chromium, gold, palladium, indium tin oxide, tantalum, silver, iridium or iridium oxide or combinations thereof.

Further, the method may comprise forming the primary CEM layer by depositing one or more layer or layers of a metal oxide, carbide or other compound selected from the group of d or f-block metals including aluminum, cadmium, chromium, cobalt, copper, gold, iron, manganese, mercury, molybdenum, nickel, palladium, rhenium, ruthenium, silver, tantalum, tin, titanium, vanadium, yttrium, and zinc or combinations thereof.

Note that the conductive substrate, the primary CEM layer and the conductive overlay may deposited by any suitable process. Suitable processes include physical vapour deposition and chemical vapour deposition, and in particular, atomic layer deposition, laser or plasma enhanced atomic layer deposition, laser or plasma enhanced chemical vapour deposition, rapid thermal or hot wire chemical vapour deposition, electron or ion beam chemical vapour deposition, cathodic arc chemical vapour deposition, sputtering, ion beam sputtering and reactive sputtering, ion plating and the like.

In one embodiment, an atomic layer deposition may be used for depositing the conductive substrate, the primary CEM layer and the conductive overlay. This atomic layer deposition may, for example, employ the same or a different organometallic precursor for forming the primary CEM layer as compared to that for the conductive substrate and/or the conductive overlay and an oxidising agent as compared to a reducing agent.

In certain embodiments, a layer or layers of the conductive substrate may be deposited by sputtering of a target comprising a metal nitride such as titanium nitride, tantalum nitride or tungsten nitride or by reactive sputtering of a metal such as titanium, tantalum or tungsten in a nitrogen atmosphere. In these embodiments, the method may also employ a dopant precursor providing for the incorporation of a dopant into a layer or layers. However, the method may alternatively or additionally comprise treating the conductive substrate with a dopant precursor following the deposition of the layers in order to incorporate a dopant into the conductive substrate.

The dopant precursor may, in particular, comprise carbon monoxide, ammonia, halogen, for example, chlorine, cyclopentadiene, methane, ethylene, acetylene as well as other unsaturated organic molecules such as isonitrile, amide, imide, amidinate or aromatics forming good ligands for transition metals.

The treatment may, in particular, comprise annealing the deposited layers with one or more dopant precursors at temperatures approximately in the range of 20.0° C. to 1000.0° C., in particular, 50.0° C. to 800.0° C. The annealing time may vary from a duration approximately of 1.0 second to 5.0 hours, in particular, from approximately 0.5 minutes to 180.0 minutes.

In other embodiments, a layer or layers of the conductive substrate may be deposited with incorporation of a dopant originating from precursor molecules AX and BY in accordance with the expression (4) below:

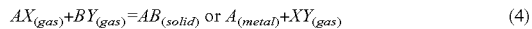

$$AX_{(gas)} + BY_{(gas)} = AB_{(solid)} \text{ or } A_{(metal)} + XY_{(gas)} \quad (4)$$

wherein "A" corresponds to a transition metal such as titanium, tantalum or tungsten and "AB" corresponds to a transition metal nitride such as titanium nitride, tantalum nitride or tungsten nitride.

In these embodiments, "X" may comprise a ligand such as an organic ligand, such as dimethylamido ($Me_2N$—), diethylamido ($Et_2N$—), tert-butylimido ($^tBuN$=), carbonyl (—CO), ethoxy (—OEt) i-propoxyl (—$O^iPr$), amido ($NH_3$—), 1- or 2-methylbutylisontrilo (MeBuNC—) and cyclo-pentadienyl (Cp). Alternatively "X" may comprise a ligand such as a halogen and, in particular, fluoro (—F), chloro (—Cl) or bromo (—Br) as well as a β-diketone or an amidinate such N,N'-di-sec butylacetamidinate or N,N'-diallylacetamidinate.

Accordingly, a titanium-based precursor may comprise titanium tetrachloride ($TiCl_4$), titanium tetraisopropoxide (TTIP), tetrakis(dimethylamido)titanium (TDMAT) or tetrakis(diethyl-amido)titanium (TDEAT). In other implementations, a tantalum-based precursor may comprise pentakis (dimethylamido)tantalum (PDMAT), tantalum ethoxide (TAETO) or tantalum pentachloride. In still other implementations, a tungsten-based precursor may comprise tungsten hexafluoride, tungsten hexacarbonyl, triamminetricarbonyltunsten, cyclopentadienyltungsten tricarbonyl hydride or tungsten pentacarbonyl 1-methylbutylisonitrile or bis(t-butylimido)-bis-(dimethylamido) tungsten.

In these embodiments, "BY" may comprise a reducing agent such as ammonia ($NH_3$), nitrogen ($N_2$), hydrogen ($H_2$), triethylsilane ($Et_3SiH$) or carbon monoxide (CO). In some embodiments one or more such reducing agents may employed or a plasma may be employed with nitrogen to form nitrogen or hydrogen radicals.

In one such embodiment, in which the reducing agent is ammonia or nitrogen, the method may provide a conductive substrate comprising a layer or layers of a doped metal nitride wherein, depending on the precursor "AX", the dopant comprises one or more of carbon, for example, in the form of carbonyl, halogen, for example chloro or chloride, or nitrogen, for example, in the form of amino or amido.

In another such embodiment, in which the reducing agent is hydrogen, the method may provide a conductive substrate comprising a layer or layers of a doped metal, such as ruthenium, iridium or platinum, wherein depending on the precursor "AX", the dopant comprises one or more of carbon, for example, in the form of carbonyl, halogen, for example chloro or chloride, or nitrogen, for example, in the form of amino or amido.

In still another such embodiment, in which the reducing agent is triethylsilane, the method may provide a conductive substrate comprising a layer or layers of cobalt silicide ($CoSi_2$). In this implementation the precursor "AX" is an organocobalt compound, such as tert-butylallyl(tricarbonyl) cobalt or dicobalt hexacarbonyl tert-butylacetylene, and the reducing agent is a trisilane such as triethylsilane.

In other embodiments, however, the method may employ a dopant precursor in addition to the precursors AX and BY. The additional dopant precursor, which may co-flow with precursor AX, may, in particular, permit the formation of ligands providing for back donation of electrons to the metal. The additional dopant precursor may, in particular, comprise methane, ethylene or acetylene and the like as well as other unsaturated organic molecules such as isonitrile, amide, imide amidinate or aromatics forming good ligands for transition metals.

In another embodiment, the method may provide a conductive substrate comprising a layer or layers of a doped metal such as tungsten, nickel, ruthenium or chromium by rapid thermal chemical vapour decomposition of their carbonyls $W(CO)_6$, $Ni(CO)_4$, $Ru_3(CO)_{12}$ and $Cr(CO)_6$. In this embodiment, the reducing agent "BY" is not necessary and carbon doped metals are obtained according to the (5) expression:

$$AX+\text{heating}=A+X \qquad (5)$$

In still another embodiment, the method may provide a conductive substrate comprising a layer or layers of a doped metal oxide such as ruthenium oxide or iridium oxide. In this embodiment, BY may be an oxidising agent such as oxygen ($O_2$), ozone ($O_3$), nitric oxide (NO) or hydrogen peroxide ($H_2O_2$).

Note that in all these embodiments, concentrations, such as atomic concentration, of the precursors "AX" and/or "BY" and/or process conditions such as temperature, flow rate and pressure, may be adjusted so as to bring about a final atomic concentration of carbon, chlorine or nitrogen in the transition metal or transition metal compound of between approximately 0.1% and 15% and preferably between approximately 2% and 15%.

In some embodiments, a layer or layers of the conductive substrate may be deposited using more than one of the above-mentioned processes or more than one of the precursors "AX" or "BY". The method may, for example, comprise depositing the bulk of the conductive substrate by reactive sputtering and depositing a layer or layers on the bulk by an atomic layer deposition or a chemical vapour deposition as described above so as to incorporate a dopant. The doped layer or layers may, in particular, be deposited to a thickness approximately between 0.1 nm and 100.0 nm, for example, between 0.5 nm and 2.0 nm.

In one embodiment, the method may comprise depositing the bulk of the conductive substrate by an atomic layer deposition or a chemical vapour deposition using a transition metal halide, such as titanium tetrachloride, tantalum pentachloride or tungsten hexafluoride, as a precursor "AX" and depositing a layer or layers on the bulk by an atomic layer deposition or chemical vapour deposition so as to incorporate a carbon or nitrogen dopant as described above. In this embodiment, however, the method may further comprise annealing the bulk before or after depositing the doped layers in order to remove chlorine or other impurities. The annealing may be carried out at temperatures approximately in the range of 20.0° C. to 1000.0° C., in particular, 50.0° C. to 800.0° C. The annealing time may vary from a duration approximately of 1.0 second to 5.0 hours, in particular, from approximately 0.5 minutes to 180.0 minutes.

The conductive overlay may be deposited on the primary CEM layer in the same way as the conductive substrate is deposited. Accordingly, the method may employ the same dopant precursors and processes as are employed for the conductive substrate and may form a conductive overlay which is substantially similar or different to the conductive substrate.

Note, however, that where the method uses more than one of the above-mentioned processes for the conductive overlay, the method may comprise depositing a layer or layers on the primary CEM layer by an atomic layer deposition or a chemical vapour deposition so as to incorporate a dopant as described above and depositing a layer or layers forming the bulk of the conductive overlay by reactive sputtering.

In another embodiment, the method may comprise depositing a layer or layers on the primary CEM layer by an atomic layer deposition or chemical vapour deposition so as to incorporate a carbon or nitrogen dopant as described above and depositing a layer or layers forming the bulk of the conductive overlay by an atomic layer deposition or a chemical vapour deposition using a transition metal halide, such as titanium tetrachloride, tantalum pentachloride or tungsten hexafluoride, as a precursor "AX". In this embodiment, the method may further comprise annealing the conductive overlay in order to remove chlorine or other impurities. The annealing may be carried out at temperatures approximately in the range of 20.0° C. to 1000.0° C., in particular, 50.0° C. to 800.0° C. The annealing time may vary from a duration approximately of 1.0 second to 5.0 hours, in particular, from approximately 0.5 minutes to 180.0 minutes.

An annealing of the conductive substrate, for example, may be carried out in order to prime the conductive substrate to forming the secondary layer of correlated electron material when the primary CEM layer is deposited. The priming of the conductive substrate may, in particular, activate a dopant and/or move it to the surface of the conductive substrate which is interfacial with the primary CEM layer.

Similarly, an annealing of the primary CEM layer with a conductive overlay may be carried out in order to optimise the formation of the secondary layer of correlated electron material by activating a dopant and/or moving it to the interfacial surface of the conductive overlay with the primary CEM layer.

As mentioned above, an annealing of the conductive substrate and/or conductive overlay may be carried out in order to incorporate dopant a dopant precursor or from the primary CEM layer. The incorporation of dopant by such annealing may comprise exposing the conductive substrate and/or conductive overlay to an atmosphere of gaseous or volatile dopant precursor.

Accordingly, the method may further comprise annealing the primary CEM layer and the conductive substrate together and/or annealing the conductive overlay on the primary CEM layer. The annealing may be carried out at temperatures approximately in the range of 20.0° C. to 1000.0° C., in particular, 50.0° C. to 800.0° C. The annealing time may vary from a duration approximately of 1.0 second to 5.0 hours, in particular, from approximately 0.5 minutes to 180.0 minutes.

The method may comprise forming the primary CEM layer by depositing a metal, metal oxide or other metal compound. The metal oxide may, in particular, comprise an comprise an oxide of nickel, aluminum, cadmium, chromium, cobalt, copper, gold, iron, manganese, mercury, molybdenum, nickel, palladium, rhenium, ruthenium, silver, tin, titanium or vanadium. Note that compounds that comprise more than one transition metal oxide may also be utilized, such as yttrium titanate ($YTiO_3$).

In a particular embodiment, the method may comprise an atomic layer deposition, for example, depositing nickel oxide materials, such as NiO:CO or $NiO:NH_3$, providing electron back-donation during operation of the CEM device in a circuit environment, for example, to give rise to a low-impedance state. Also during operation in a circuit environment, for example, electron back-donation may be reversed so as to give rise to a substantially dissimilar impedance state, such as a high-impedance state, for example.

In particular embodiments, the primary CEM layer may be deposited utilizing separate precursor molecules, AX and BY, according to expression (6) below:

$$AX_{(gas)} + BY_{(gas)} = AB_{(solid)} + XY_{(gas)} \quad (6)$$

wherein "A" of expression (6) corresponds to a transition metal, and "AB" a transition metal compound such as a transition metal oxide.

In these embodiments, "X" of expression (6) may comprise a ligand, such as organic ligand, comprising amidinate (AMD), dicyclopentadienyl $(Cp)_2$, diethylcyclopentadienyl $(EtCp)_2$, bis(2,2,6,6-tetramethylheptane-3,5-dionato) $((thd)_2)$, acetylacetonate (acac), bis(methylcyclopentadienyl) $((CH_3C_5H_4)_2)$, dimethylglyoximate $(dmg)_2$, 2-amino-pent-2-en-4-onato $(apo)_2$, $(dmamb)_2$ where dmamb=1-dimethylamino-2-methyl-2-butanolate, (dmamp)2 where dmamp=1-dimethylamino-2-methyl-2-propanolate, bis(pentamethylcyclopenta-dienyl) $(C_5(CH_3)_5)_2$ and carbonyl $(CO)_4$.

Accordingly, in some embodiments, nickel-based precursor AX may comprise, for example, nickel amidinate (Ni (AMD)), nickel dicylcopentadienyl $(Ni(Cp)_2)$, nickel diethylcyclopentadienyl $(Ni(EtCp)_2)$, bis(2,2,6,6-tetramethylheptane-3,5-dionato)Ni(II) $(Ni(thd)_2)$, nickel acetylacetonate $(Ni(acac)_2)$, bis(methylcyclopentadienyl) nickel $(Ni(CH_3C_5H_4)_2$, nickel dimethylglyoximate (Ni $(dmg)_2)$, nickel 2-amino-pent-2-en-4-onato $(Ni(apo)_2)$, $Ni(dmamb)_2$ where dmamb=1-dimethylamino-2-methyl-2-butanolate, $Ni(dmamp)_2$ where dmamp=1-dimethylamino-2-methyl-2-propanolate, bis(pentamethylcyclopentadienyl) nickel $(Ni(C_5(CH_3)_5)_2$, and nickel carbonyl $(Ni(CO)_4)$, just to name a few examples.

In expression (6), precursor "BY" may comprise an oxidising agent, such as oxygen $(O_2)$, ozone $(O_3)$, nitric oxide (NO), hydrogen peroxide $(H_2O_2)$, just to name a few examples. In other embodiments, plasma may be used with an oxidising agent to form oxygen radicals.

However, in particular embodiments, a dopant comprising a back-donating material in addition to precursors AX and BY may be utilized to form the primary CEM layer. An additional dopant ligand comprising a back-donating material, which may co-flow with precursor AX, may permit formation of back-donating compounds, substantially in accordance with expression (7), below.

In particular embodiments, a dopant comprising a back-donating material, such as ammonia $(NH_3)$, methane $(CH_4)$, carbon monoxide (CO), or other material may be utilized, as may other ligands comprising carbon or nitrogen or other dopants comprising back-donating materials listed above. Thus, expression (6a) may be modified to include an additional dopant ligand comprising a back-donating material substantially in accordance with expression (7), below:

$$AX_{(gas)} + (NH_3 \text{ or other ligand comprising nitrogen}) + BY_{(gas)} = AB:NH_{3(solid)} + XY_{(gas)} \quad (7)$$

In expression (7), "BY" may comprise an oxidizer, such as oxygen $(O_2)$, ozone $(O_3)$, nitric oxide (NO), hydrogen peroxide $(H_2O_2)$, just to name a few examples. In other embodiments, plasma may be used with an oxidizer (BY) to form oxygen radicals. Likewise, plasma may be used with the doping species comprising a back-donating material to form an activated species to control the doping concentration of the primary CEM layer.

Note that concentrations, such as atomic concentration, of precursors, such as AX, BY, and $NH_3$ (or other ligand comprising nitrogen) of expressions (6) and (7) may be adjusted so as to bring about a final atomic concentration of nitrogen or carbon dopant comprising a back-donating material in a fabricated CEM device, such as in the form of ammonia $(NH_3)$ or carbonyl (CO) comprising a concentration of between approximately 0.1% and 15.0%.

In particular embodiments, such as embodiments utilizing atomic layer deposition, a substrate may be exposed to precursors, such as AX and BY, as well as dopants comprising back-donating materials (such as ammonia or other ligands comprising metal-nitrogen bonds, including, for example, nickel-amides, nickel-imides, nickel-amidinates, or combinations thereof) in a heated chamber, which may attain, for example, a temperature approximately in the range of 20.0° C. to 1000.0° C., for example, or between temperatures approximately in the range of 20.0° C. and 500.0° C. in certain embodiments.

In one particular embodiment, in which atomic layer deposition of $NiO:NH_3$, for example, is performed, temperature ranges approximately in the range of 20.0° C. and 400.0° C. may be utilized. Responsive to exposure to precursor gases (e.g., AX, BY, $NH_3$ or other ligand comprising nitrogen), such gases may be purged from the heated chamber for durations approximately in the range of 0.5 seconds to 180.0 seconds.

In certain embodiments, a single two-precursor cycle (e.g., AX and BY, as described with reference to expression (7)) or a single three-precursor cycle (e.g., AX, $NH_3$, $CH_4$, or other ligand comprising nitrogen, carbon or other dopant comprising a back-donating material, and BY, as described with reference to expression (7) utilizing atomic layer deposition may bring about a primary CEM layer comprising a thickness approximately in the range of 0.6 Å to 5.0 Å per cycle).

Accordingly, in an embodiment, to form a primary CEM layer comprising a thickness of approximately 500.0 Å, an atomic layer deposition process in which layers comprise a thickness of approximately 0.6 Å, 800-900 cycles, for example, may be utilized. In another embodiment, an atomic layer deposition process in which layers comprise approximately 5.0 Å, 100 two-precursor cycles, for example, may be utilized. Note that atomic layer deposition may be utilized to form a primary CEM layer having other thicknesses, such as thicknesses approximately in the range of 1.5 nm and 150.0 nm.

In particular embodiments, responsive to one or more two-precursor cycles (e.g., AX and BY), or three-precursor cycles (AX, $NH_3$, $CH_4$ or other ligand comprising nitrogen, carbon or other dopant comprising a back-donating material and BY), of atomic layer deposition, a primary CEM layer may undergo in situ annealing, which may permit improvement of layer properties or may be used to incorporate the dopant comprising a back-donating material, such as in the form of carbonyl or ammonia, in the primary CEM layer.

In certain embodiments, a chamber may be heated to a temperature approximately in the range of 20.0° C. to 1000.0° C. However, in other embodiments, in situ annealing may be performed utilizing temperatures approximately in the range of 50.0° C. to 800.0° C. In situ annealing times may vary from a duration approximately in the range of 1.0 seconds to 5.0 hours. In particular embodiments, annealing times may vary within more narrow ranges, such as, for example, from approximately 0.5 minutes to approximately 180.0 minutes.

In a fourth aspect, the present disclosure provides a switching device comprising a correlated electron material, wherein a primary layer of a correlated electron material is provided over a conductive substrate and a secondary layer of a correlated electron material is provided between the conductive substrate and the primary CEM layer.

The conductive substrate may, in particular, comprise a metal or metal compound and the primary CEM layer comprise a metal compound. In that case, the metal of the conductive overlay may be the same as that of the secondary CEM layer and/or different to that of the primary CEM layer.

In a fifth aspect, the present disclosure provides a switching device comprising a correlated electron material, wherein a conductive overlay is provided over a primary layer of a correlated electron material and a secondary layer of a correlated electron material is provided between the conductive overlay and the primary CEM layer.

The conductive overlay may, in particular, comprise a metal or metal compound and the primary CEM layer may comprise a metal compound. In that case, the metal of the conductive overlay may be the same as that of the secondary CEM layer and/or different to that of the primary CEM layer.

In a sixth aspect, the present disclosure provides a switching device comprising a correlated electron material, wherein a primary layer of a correlated electron material is provided over a conductive substrate and a conductive overlay is provided over the primary CEM layer and wherein a secondary layer of a correlated electron material is provided between the primary CEM layer and the conductive substrate and the primary CEM layer and the conductive overlay.

The conductive substrate and overlay may, in particular, comprise a metal or metal compound and the primary CEM layer may comprise a metal compound. In that case, the metal of the conductive substrate and of the conductive overlay may be the same as that of the secondary CEM layer and/or different to that of the primary CEM layer.

In these aspects, the conductive substrate may, in particular, comprise titanium nitride comprising one or more of chlorine, carbon and nitrogen as dopant. Alternatively, the conductive substrate may comprise tantalum nitride comprising one or more of chlorine, carbon and nitrogen as dopant or tungsten nitride comprising one or more of chlorine, carbon and nitrogen as dopant.

Further, the conductive overlay may comprise titanium nitride comprising one or more of chlorine, carbon and nitrogen as dopant, tantalum nitride comprising one or more of chlorine, carbon and nitrogen as dopant or tungsten nitride comprising one or more of chlorine, carbon or nitrogen as dopant.

The conductive substrate and/or conductive overlay may additionally or alternatively comprise platinum, titanium, copper, aluminum, cobalt, nickel, tungsten, cobalt silicide, ruthenium, ruthenium oxide, chromium, gold, palladium, indium tin oxide, tantalum, silver, iridium, indium oxide or any combination thereof.

In certain embodiments, the secondary CEM layer may comprise an oxidised layer of metal nitride, such as titanium nitride, tantalum nitride or tungsten nitride. It may, in particular, comprise $NiTiO_xN_y$, $NiTaO_xN_y$, or $NiWO_xN_y$ wherein $y=1-x$ and $x+y$ ranges between 0.7 and 1.4. The stoichiometry of the secondary CEM layer is, however, not particularly important but it is preferred that the secondary CEM layer is substantially free from unbound metal, viz., metal in a zero oxidation state.

In other embodiments, the secondary CEM layer may comprise a metal oxide, such as an oxide of titanium, copper, aluminum, cobalt, nickel, tungsten, ruthenium, chromium, gold, palladium, indium, tin, tantalum, silver, iridium or any combination thereof. The secondary CEM layer may, in particular comprise an oxide of the same or a different conducting type (p-type or n-type) as the oxide of the primary CEM layer. Preferably, however, the oxide of the secondary CEM layer is a p-type oxide (such as titanium oxide or copper oxide) and the oxide of the primary CEM layer is a p-type oxide.

The thickness of the secondary CEM layer may vary between 0.1 nm and 50 nm, for example, between 0.1 and 10 nm. The extent of the doping of the secondary CEM layer (and other layers in the conductive substrate and/or conductive overlay) may be similar to that of the primary CEM layer. The doping may, for example, range between 0 to 15 atom %, for example, from 2 to 15 atom %.

Note that the impedance of the secondary CEM layer will be substantially lower than the impedance of the corresponding oxidised layer and that avoidance of a need for filament-forming voltages may preserve the "born on" property of a CEM switching device, which refers to a CEM switching device's ability to exhibit a relatively low impedance (relatively high conductivity) responsive to manufacture of the device.

Note also that the secondary CEM layer may switch from a relatively conductive/lower impedance state to a relatively insulative/higher impedance state in concert with a corresponding switch in the primary CEM layer. Alternatively, it may remain in a relatively conductive/lower impedance state when the primary CEM layer switches from a relatively conductive/lower impedance state to a relatively insulative/higher impedance state.

The primary CEM layer may comprise any transition metal oxide, such as, for example, perovskites, Mott insulators, charge exchange insulators, and Anderson disorder insulators. In particular implementations, the primary CEM layer may be formed from switching materials, such as nickel oxide, cobalt oxide, iron oxide, yttrium oxide, and perovskites, such as chromium doped strontium titanate, lanthanum titanate, and the manganate family including praseodymium calcium manganate, and praseodymium lanthanum manganite, just to provide a few examples. In particular, oxides incorporating elements with incomplete "d" and "f" orbital shells may exhibit sufficient impedance switching properties for use as the primary CEM layer.

The primary CEM layer may, in particular, comprise materials that are transition metal oxide variable impedance materials, such as nickel oxide (NiO). NiO materials discussed herein may be doped with extrinsic ligands, which may stabilize variable impedance properties. In particular, NiO variable impedance materials disclosed herein may include nitrogen-containing molecules of the form $C_xH_yN_z$ (in which $x,y \geq 0$, and $N \geq 1$) such as: ammonia ($NH_3$), cyano ($CN^-$), azide ion ($N_3^-$) ethylene diamine ($C_2H_8N_2$), phen (1,10-phenanthroline) ($C_{12}H_8N_2$), 2,2'bipyridine ($C_{10}$, $H_8N_2$) ethylenediamine (($C_2H_4$ ($NH_2$)$_2$), pyridine ($C_5H_5N$), acetonitrile ($CH_3CN$), and cyanosulfanides such as thiocyanate ($NCS^-$), for example. Members of a nitrogen oxide family ($N_xO_y$), which may include, for example, nitric oxide (NO), nitrous oxide ($N_2O$), nitrogen dioxide ($NO_2$), or precursors with an $NO_3^-$ ligand. In embodiments, metal precursors comprising nitrogen-containing ligands, such as ligands amines, amides, alkylamides nitrogen-containing ligands with NiO by balancing valences.

The NiO variable impedance materials may include a carbon-containing ligand such as carbonyl (CO), forming NiO:CO. In another particular example, NiO doped with extrinsic ligands may be expressed as $NiO:L_x$, where $L_x$ is a ligand element or compound and x indicates a number of units of the ligand for one unit of NiO. One skilled in the art may determine a value of x for any specific ligand and any specific combination of ligand with NiO or any other transition metal compound simply by balancing valences. Other dopant ligands comprising back donating materials in addition to carbonyl include: nitrosyl (NO), triphenylphosphine (PPH$_3$), phenanthroline (C$_{12}$H$_8$N$_2$), bipyridine (C$_{10}$H$_8$N$_2$), ethylenediamine [C$_2$H$_4$ (NH$_2$)$_2$] ammonia (NH$_3$), acetonitrile (CH$_3$CN), Fluoride (F), Chloride (Cl), Bromide (Br), cyanide (CN), sulfur (S) and others.

In particular embodiments, changes in impedance states of the primary CEM layer, such as from a low-impedance state to a substantially dissimilar high-impedance state, for example, may be brought about by the "back-donation" of electrons of compounds comprising Ni$_x$O$_y$ (wherein the subscripts "x" and "y" comprise whole numbers).

As the term is used herein, "back-donation" refers to a supplying of one or more electrons to a transition metal, transition metal oxide, or any combination thereof, by an adjacent molecule of the lattice structure, for example, comprising the transition metal, transition metal compound, transition metal oxide, or combination thereof. Back-donation permits a transition metal, transition metal compound, transition metal oxide, or combination thereof, to maintain an ionization state that is favorable to electrical conduction under an influence of an applied voltage.

In certain embodiments, back-donation in a CEM, for example, may occur responsive to use of carbonyl (CO) or a nitrogen-containing dopant comprising a back-donating material, such as ammonia (NH$_3$), ethylene diamine (C$_2$H$_8$N$_2$), or members of a nitrogen oxide family (N$_x$O$_y$), for example, which may permit a CEM to exhibit a property in which electrons are controllably, and reversibly, "donated" to a conduction band of the transition metal or transition metal oxide, such as nickel, for example, during operation of a device or circuit comprising a CEM. Back donation may be reversed, for example, in nickel oxide material (e.g., NiO:CO or NiO:NH$_3$), thereby permitting the nickel oxide material to switch to exhibiting a substantially dissimilar impedance property, such as a high-impedance property, during device operation.

Thus a back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the material.

In some embodiments, by way of back-donation, the primary CEM layer may exhibit low-impedance properties if the transition metal, nickel for example, is placed into an oxidation state of 2+ (e.g., Ni$^{2+}$ in a material, such as NiO:CO or NiO:NH$_3$). Conversely, electron back-donation may be reversed if the transition metal, nickel for example, is placed into an oxidation state of either 1+ or 3+. Accordingly, during operation of the CEM switching device, back-donation may result in a "disproportionation," which may comprise substantially simultaneous oxidation and reduction reaction, substantially in accordance with the expression (8) below:

$$2Ni^{2+} \rightarrow Ni^{1+} + Ni^{3+} \tag{8}$$

Such disproportionation may bring about, for example, a relatively high-impedance state during operation of the CEM switching device.

In some embodiments, a dopant comprising a back-donating material, such as a carbon containing ligand, carbonyl (CO) or a nitrogen-containing ligand, such as an ammonia molecule (NH$_3$), may permit sharing of electrons during operation of the CEM switching device so as to permit the disproportionation and its reversal, substantially in accordance with the expression (9) below:

$$Ni^{1+} + Ni^{3+} \rightarrow 2Ni^{2+} \tag{9}$$

A reversal of the disproportionation reaction permits the nickel-based CEM switching device to return to a relatively low-impedance state.

$V_{reset}$ and $V_{set}$, as shown in FIG. 1A, may vary, depending on a molecular concentration of NiO:CO or NiO:NH$_3$ (for example, between 0.1 atom % and 15.0 atom %), in the range of approximately 0.1 V to 10.0 V subject to the condition that $V_{set} \geq V_{reset}$. For example, $V_{reset}$ may occur at a voltage approximately in the range of 0.1 V to 1.0 V, and $V_{set}$ may occur at a voltage approximately in the range of 1.0 V to 2.0 V. It should be noted, however, that variations in $V_{set}$ and $V_{reset}$ may occur based, at least in part, on other process variations.

In some embodiments, the primary CEM layer may exhibit a "born on" property in which it exhibits a relatively low impedance (relatively high conductivity) following the manufacture of the device. Accordingly, if the CEM switching device is integrated into a larger electronics environment, for example, at initial activation a relatively small voltage applied to a CEM device may permit a relatively high current flow through the CEM switching device, as shown by region 104 of FIG. 1A. For example, as previously described herein, $V_{reset}$ may occur at a voltage approximately in the range of 0.1 V to 1.0 V, and $V_{set}$ may occur at a voltage approximately in the range of 1.0 V to 2.0 V. Accordingly, electrical switching voltages operating in a range of approximately 2.0 V, or less, may permit a memory circuit, for example, to write to a CERAM memory device, to read from a CERAM memory device, or to change state of a CERAM switch, for example. Such relatively low voltage operation may reduce complexity, cost, and may provide other advantages over competing memory and/or switching device technologies.

Further embodiments in the aforementioned aspects will be apparent from the general description which follows wherein reference is made to the following drawings:

FIGS. 4 and 5 show flow charts generally illustrating the manufacture of CEM switching devices according to several embodiments of the present disclosure.

Figure 1A:
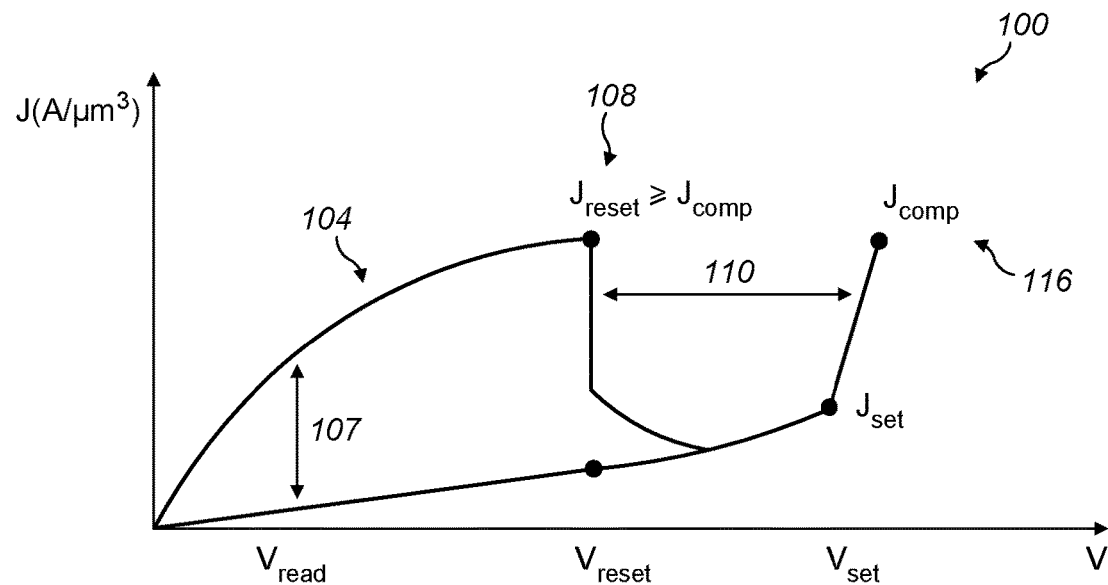
FIG. 1A shows a schematic illustration of a current density versus voltage profile of a CEM switching device.
Figure 1B:
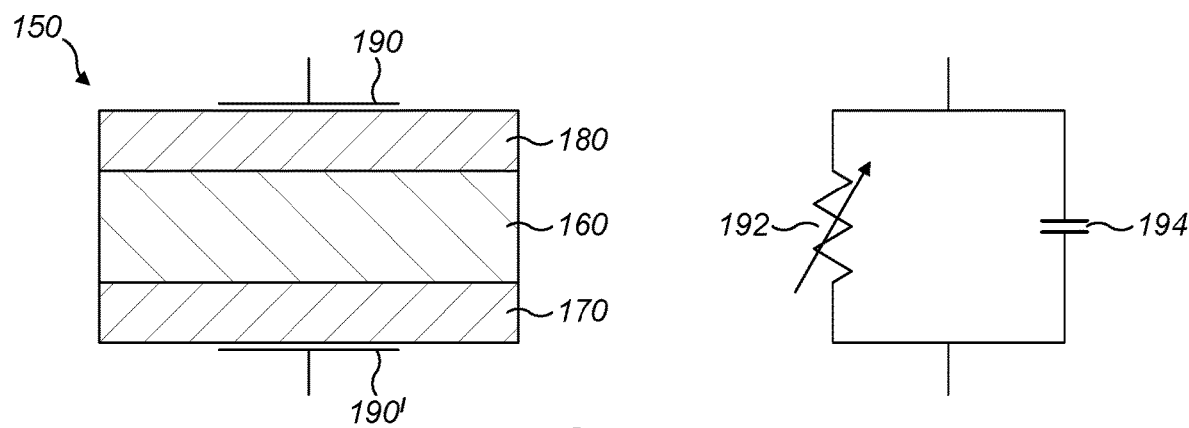
FIG. 1B shows a schematic illustration of the CEM switching device of FIG. 1A and a schematic diagram of an equivalent circuit for the switching device.
Figure 2A:
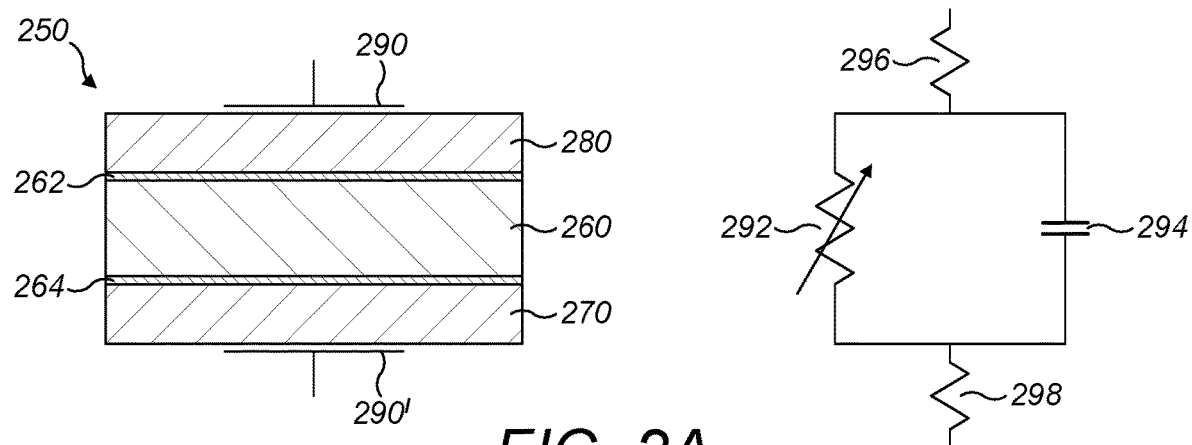
FIG. 2A shows a schematic illustration of a CEM switching device having an oxide as interfacial layers between a conductive substrate and the correlated electron material and a schematic diagram of an equivalent circuit for the switch.

Referring now to FIG. 2A, there is shown a switching device 250, such as may be used as a storage element, wherein interfacial layers 262 and 264 of a relatively high impedance oxide have formed between the CEM layer 260 and the conductive substrate 270 and conductive overlay 280. The device may be represented by a circuit diagram similar to that shown for the device of FIG. 1 except that it also comprises series resistors 296 and 298. The conductive substrate and/or conductive overlay may comprise a titanium nitride fabricated in layers utilizing, for example, sputtering, chemical vapor deposition, atomic layer deposition, or other suitable process and the CEM layer may comprise nickel oxide, for example, Ni:CO fabricated in layers utilizing, for example, atomic layer deposition or other suitable processes.

As shown in FIG. 2A, an oxidation layer 262 may be present and may be modeled using equivalent resistance disposed between device terminal 290 and the parallel combination of variable resistance 292 with variable capacitance 294. Likewise, the oxidation layer 264 may be modeled using equivalent resistance 298 disposed between device terminal 290' and the parallel combination of variable resistance 292 with variable capacitance 294. The resistances 296 and 298 may bring about degraded electrical performance of a CEM switching device.

In this device, responsive to application of a voltage within a particular range, such as, for example, between approximately 3.0 V and approximately 4.0 V, oxidation layer 262 may develop one or more filaments which may comprise conductive crystalline, low-resistance paths between conductive overlay 280 and the CEM layer 260. Likewise, a voltage of between, for example, approximately 3.0 V and approximately 4.0 V may bring about formation of filaments in oxidation layer 264 between the CEM layer 260 and conductive substrate 270. Formation of filaments may bring about operation of a switching device that more closely approximates the current density versus voltage profile of FIG. 1A.

Thus, $V_{read}$, $V_{reset}$, and $V_{set}$ may be substantially (and undesirably) increased. In one possible example, $V_{set}$ may comprise a voltage level approximately in the range of 3.0 V to 4.0 V, for example. Thus, electrical switching voltages to bring about a change of state of a CERAM memory device, for example, may be increased significantly, such as from approximately 1.0 V to 2.0 V as described in reference to FIG. 1A, for example, to 3.0 V to 4.0 V, at least in certain instances as described with reference to FIG. 2A.

Although the formation of filaments within the oxidation layers 262 and 264 may permit the device to perform switching operations responsive to application of voltage levels approximately in the range of 2.0 V, or less, for example, the need to apply filament-forming voltages of, for example, approximately 3.0 V to approximately 4.0 V may be undesirable.

Accordingly, in certain devices, it may be advantageous to reduce or eliminate a need to form conductive filaments so as to allow a low-impedance path for electrical current flowing from conductive substrate to CEM film and to conductive material, for example.

Avoidance of a need for filament-forming ("breakdown") voltages may preserve the "born on" property of a CEM switching device, which refers to a CEM switching device's ability to exhibit a relatively low impedance (relatively high conductivity) responsive to fabrication of the device.

Figure 3A:
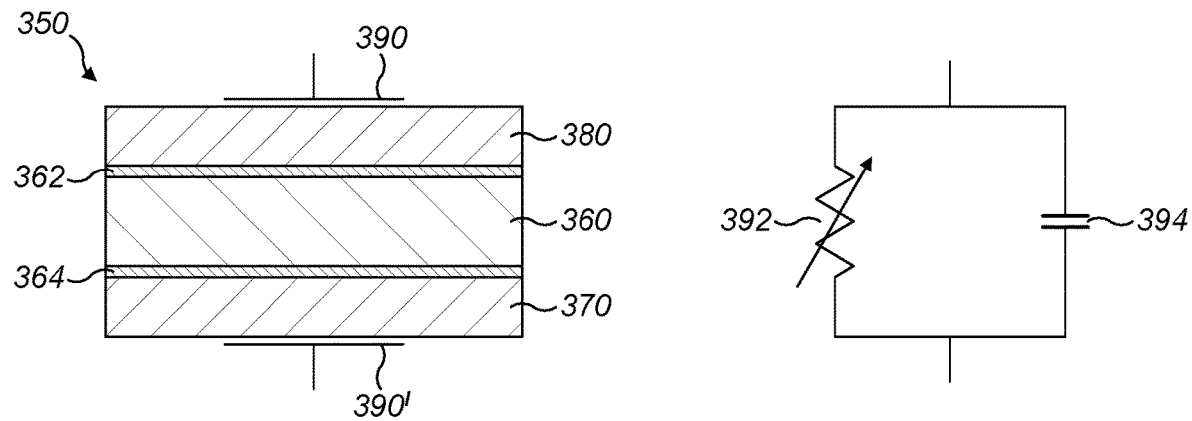
FIG. 3A shows a schematic illustration of one embodiment of the CEM switching device of the present disclosure and a schematic diagram of an equivalent circuit for the switching device.

Referring now to FIG. 3A, there is shown a CEM switching device 350, such as may be used as a storage element, wherein interfacial layers 362 and 364 of relatively low impedance oxide has formed between the CEM layer 360 and the conductive substrate 370 and conductive overlay 380. The conductive substrate 370 and/or conductive overlay 380 may comprise titanium nitride fabricated in layers utilizing, for example, sputtering, chemical vapor deposition, atomic layer deposition, or other suitable process so that a dopant is incorporated at least in the region contacting the CEM layer 360. The CEM layer 360 may comprise nickel oxide, for example, Ni:CO fabricated in layers by, for example, atomic layer deposition or other suitable processes.

The metal oxide of the interfacial layers 362 and 364 are doped so that the interfacial layers each comprise a secondary layer of a correlated electron material. This secondary CEM layer 362, 364 is formed in situ when the oxidation layer is formed and in a relatively low impedance state. Because the secondary layers 362 and 364 are relatively conducting (as compared to the primary CEM layer 360), the device does not require the application of a relatively high filament-forming voltages before its switching operation.

Figure 2B:
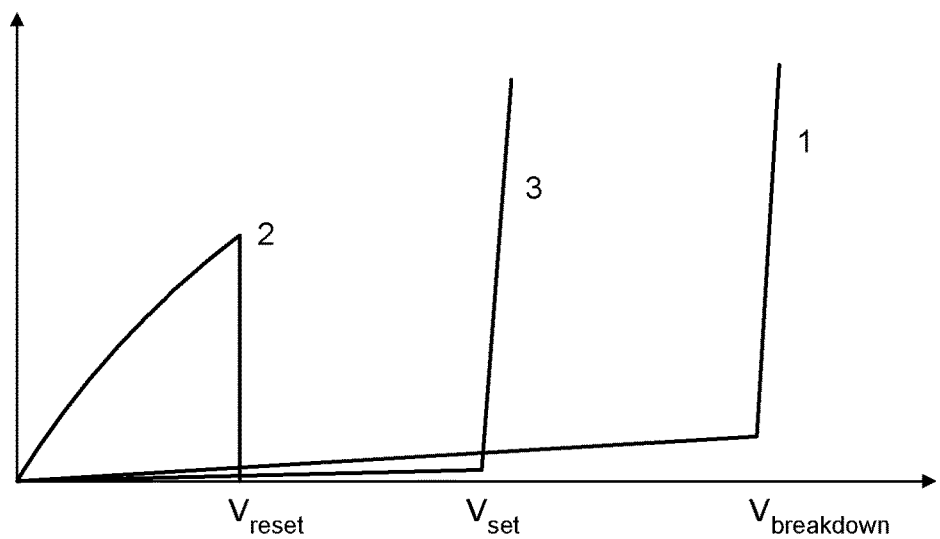
FIG. 2B shows a schematic illustration of a current density versus voltage profile for the CEM switching device of FIG. 2A.
Figure 3B:
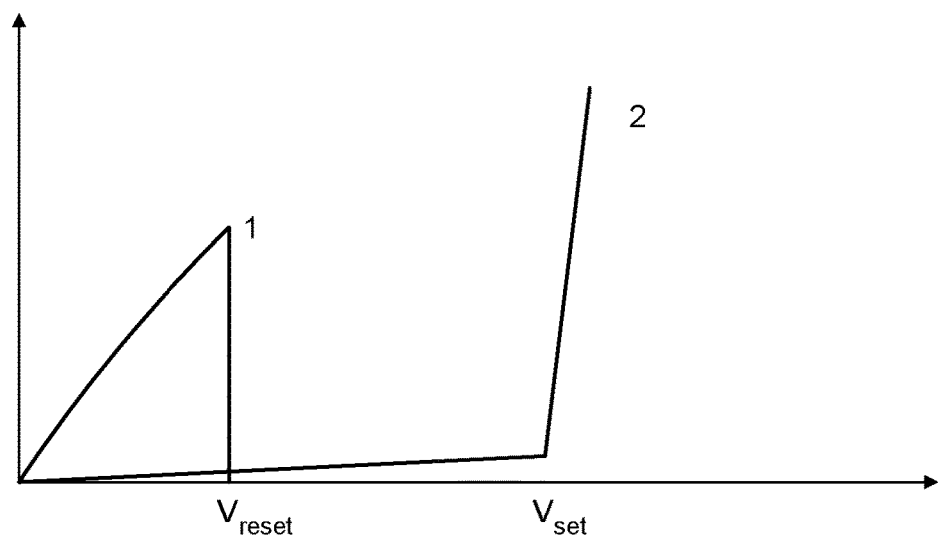
FIG. 3B shows a schematic illustration a part current density versus voltage profile for the CEM switching device of FIG. 3A.

FIGS. 2B and 3B shows a comparison between the voltages that may be applied to the CEM switching devices of FIG. 2A and FIG. 3A. If the secondary CEM layers 362 and 364 are modeled in the same way as the oxidation layers of the CEM switching device of FIG. 2, the equivalent circuit is the same as that shown for the CEM switching device of FIG. 1B viz. comprising the parallel combination of variable resistance 392 with variable capacitance 394.

Referring now to FIGS. 4 and 5, flow diagrams illustrate various ways of forming respectively the conductive substrate and the conductive overlay for a CEM switching device. Taken together, these Figures illustrate several ways for forming the switching device shown in FIG. 3A.

As may be seen, the method may comprise the formation of a conductive substrate and the formation of a primary layer of correlated electron material on the conductive substrate. At least a portion of the conductive substrate must be doped by a dopant providing for the formation of an interfacial layer between the conductive substrate and the primary layer as a correlated electron material.

Three alternatives are presented in FIG. 4 for forming the conductive substrate comprising forming substantially the whole of the conductive substrate by deposition of conducting layers incorporating a dopant, forming a top part of the conductive substrate from such layers or treating a conductive substrate so that it incorporates a dopant.

The treatment of a conductive substrate may comprise annealing it before forming the primary layer in the presence of one or more suitable carbon containing or nitrogen containing molecules such as those mentioned above.

Alternatively, the treatment of the conductive substrate may comprise annealing it with the primary layer so that the dopant of the primary layer diffuses into the conductive substrate.

An annealing may be carried out anyway so that the dopant of the conductive substrate is activated or diffuses towards the primary layer.

It may also be carried out in order to remove impurities such as chlorine when the conductive substrate is doped or to be doped by a dopant other than chlorine and is formed in part from a chloride precursor molecule.

Although not shown in FIG. 4, an annealing for the purpose of removing impurities such as chlorine can also be carried out during the forming of the conductive substrate (prior to depositing a doped layer or layers) or after the forming of the conductive substrate (and prior to depositing the primary layer).

The method may alternatively or additionally comprise the formation of a conductive overlay on a primary layer of correlated electron material. At least a portion of the conductive overlay must be doped by a dopant providing for the formation of an interfacial layer between the conductive overlay and the primary layer as a correlated electron material.

Three alternatives are presented in FIG. 5 for forming the conductive overlay comprising forming substantially the whole of the conductive overlay by deposition of conducting layers incorporating a dopant, forming a bottom part of the conductive overlay from such layers or treating a conductive substrate so that it incorporates a dopant.

The treatment of a conductive overlay may comprise annealing it on the primary layer in the presence of one or more suitable carbon containing or nitrogen containing molecules such as those mentioned above.

Alternatively, the treatment of the conductive overlay may comprise annealing it with the primary layer so that the dopant of the primary layer diffuses into the conductive overlay.

An annealing may be carried out anyway so that the dopant of the conductive overlay is activated or diffuses towards the primary layer.

It may also be carried out in order to remove impurities such as chlorine when the conductive overlay is doped by a dopant other than chlorine and is formed in part from a chloride precursor molecule.

Of course, an annealing may additionally or alternatively be carried out so that the conductive substrate and the conductive overlay are annealed together with the primary layer.

Figure 6:
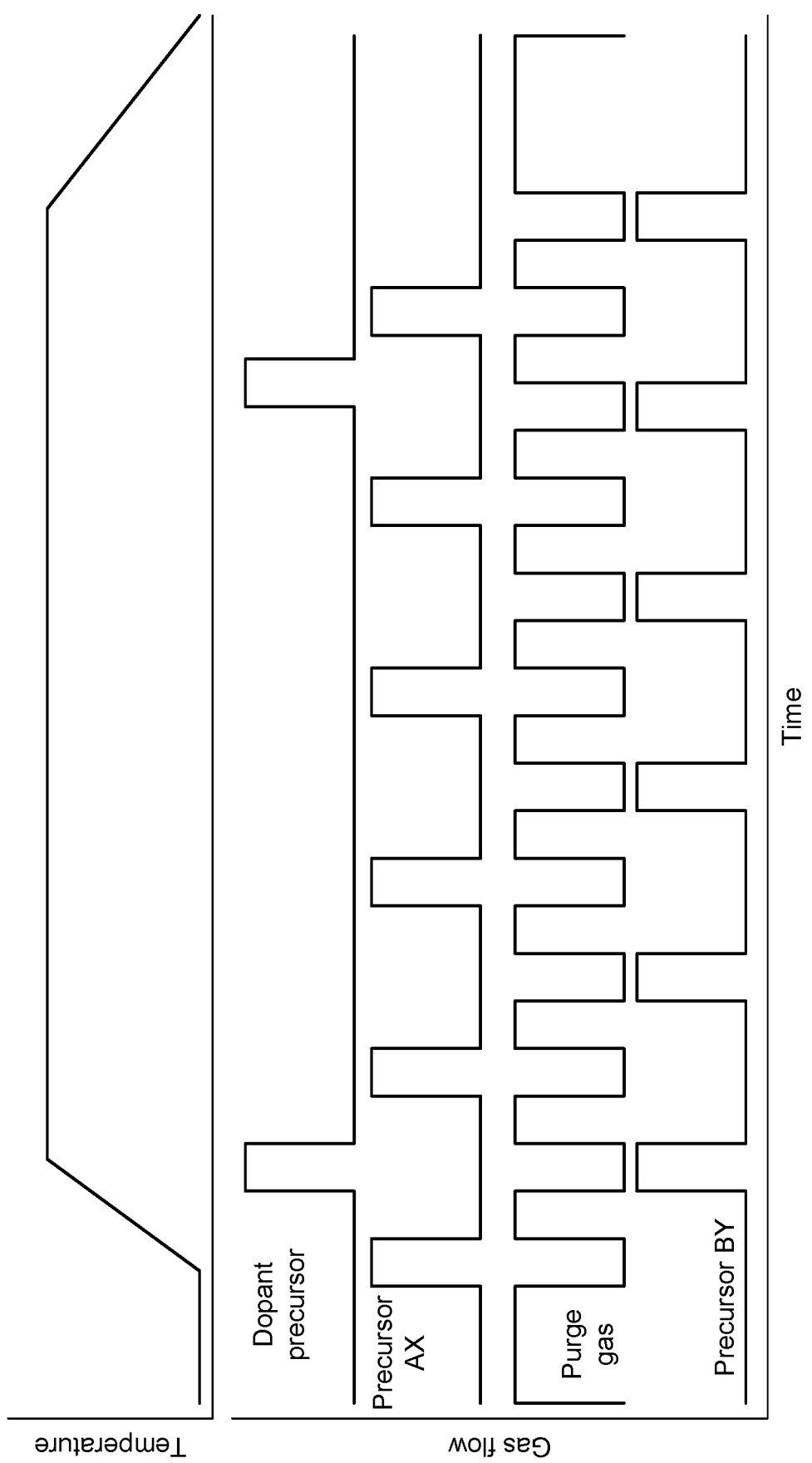
FIGS. 6 and 7 show gas flow and temperature profiles illustrating the manufacture of CEM switching devices according to several embodiments of the present disclosure.
Figure 7:
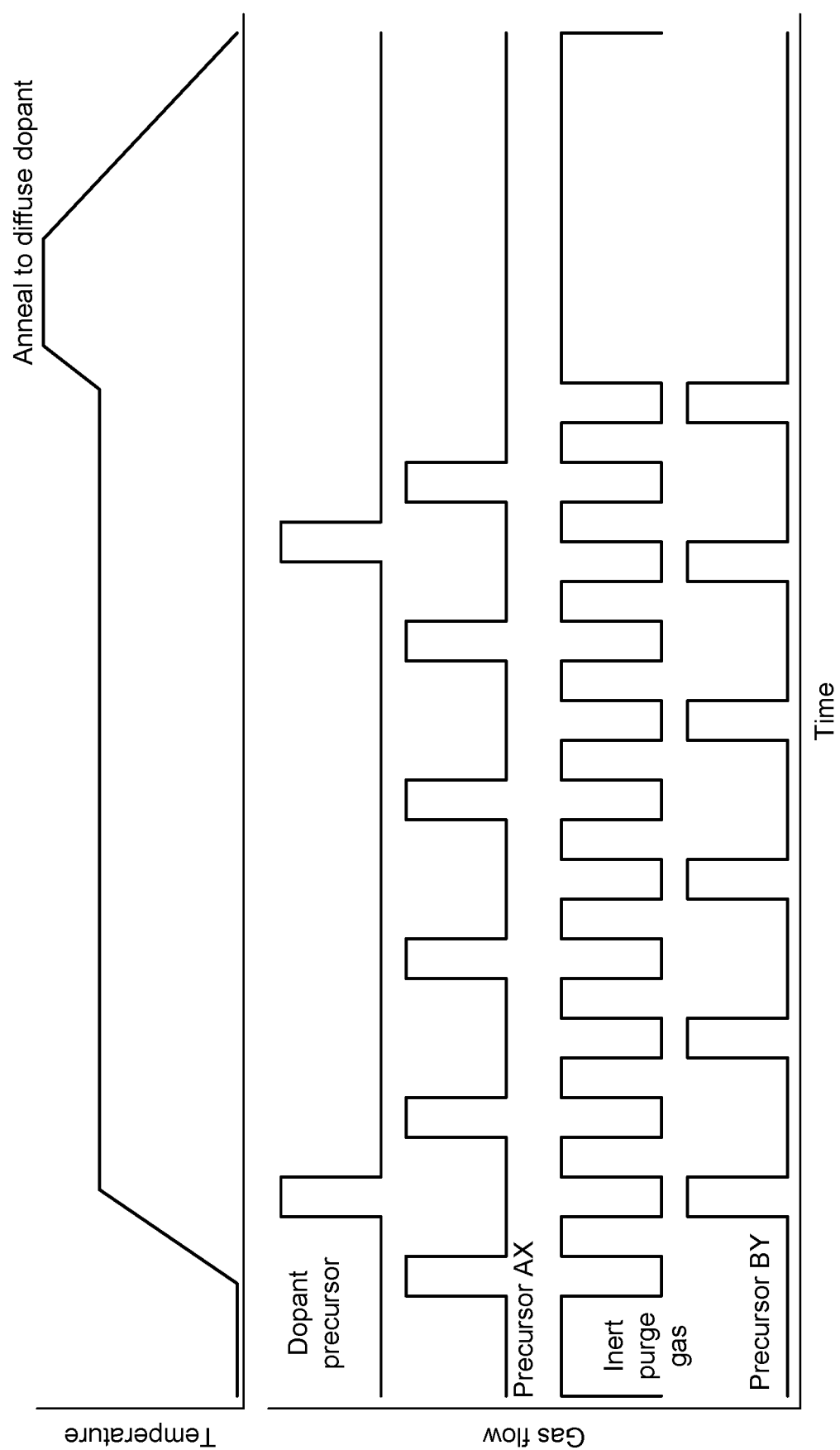

Referring now to FIGS. 6 and 7, there is shown gas flow and a temperature profiles for obtaining the conductive substrate and the conductive overlay of a CEM switching device.

The profiles are for an atomic layer deposition employing sequential pulsing of a first precursor "AX", for example, tetrakis(dimethylamido)titanium (TDMAT) and a second precursor "BY", for example, ammonia ($NH_3$) with intervening pulsing with a purge gas, for example, nitrogen ($N_2$).

Each plot of gas flow against time represents the forming of the conductive substrate and/or the forming the conductive overlay. The peaks relating to dopant precursor may be additional to the precursors AX and BY and are alternatives reflecting the deposition of a doped layer in the conductive substrate for contacting the primary layer (late) and the deposition of a doped layer in the conductive overlay (early) contacting the primary layer.

In one deposition, in which the additional dopant precursor is not employed, the process conditions (flow rate or residence time, temperature, pressure etc) for the sequential pulsing of TDMAT and $NH_3$ are arranged for the deposition of a conductive substrate of titanium nitride comprising carbon as dopant wherein the carbon dopant originates from TDMAT. The same precursors and process conditions are employed for the deposition of a conductive overlay of titanium nitride comprising carbon as dopant wherein the carbon dopant originates from TDMAT.

In another deposition, in which an additional dopant precursor is employed, the process conditions for the sequential pulsing of TDMAT and $NH_3$ are arranged for the deposition of the bulk of a conductive substrate of titanium nitride. In this deposition, the additional precursor, which may for example, comprise carbon monoxide (CO), is introduced with the gas flow of $NH_3$ at a late stage in the sequence so that a layer of titanium nitride comprising carbon as dopant is formed on the bulk.

In another deposition, in which the additional dopant precursor comprises a nitrogen containing compound, such as one of those mentioned above, the process conditions for the sequential pulsing of TDMAT and $NH_3$ are arranged for the deposition of the bulk of a conductive substrate of titanium nitride comprising carbon as dopant wherein the carbon originates from TDMAT. In this deposition, the additional dopant precursor, is introduced with the gas flow of $NH_3$ at a late stage in the pulsing sequence so that a layer of titanium nitride comprising carbon and nitrogen as dopant is formed on the bulk.

The same precursors and process conditions may be used for forming the conductive overlay although the additional dopant precursor is introduced with the gas flow of $NH_3$ at an early stage in the pulsing sequence. In these depositions, the conductive overlay may be formed as a bulk comprising titanium nitride or carbon doped titanium nitride with an underlay comprising one or other of a carbon doped titanium nitride or a carbon and nitrogen doped titanium nitride.

Note that the temperature may be held constant throughout the deposition of the layers forming the conductive substrate and conductive overlay (FIG. 6) but that a subsequent annealing may be carried out at a temperature which is higher than that employed for the deposition (FIG. 7). The annealing has the effect of moving the dopant to the surface of a conductive substrate which is interfacial when the primary layer is deposited or moving the dopant to the interfacial surface of the conductive overlay with the primary layer.

What is claimed is:

1. A method for the manufacture of a switching device, which method comprises:
   forming a conductive substrate and forming a primary layer of a correlated electron material on the conductive substrate,
   wherein the forming of the conductive substrate comprises forming at least a portion of the conductive substrate incorporating a dopant prior to forming the primary layer on the conductive substrate, and
   wherein the forming of the primary layer to lead to formation of a first secondary layer of a correlated electron material between the primary layer and the conductive substrate.

2. The method according to claim 1, further comprising forming the at least a portion of the conductive substrate by depositing a layer of doped metal or metal compound, or a combination thereof, or by depositing a layer of a metal or metal compound, or a combination thereof, and treating the deposited layer to incorporate the dopant.

3. The method according to claim 2, comprising treating the deposited layer by annealing the deposited layer following formation of the primary layer.

4. The method according to claim 1, wherein the forming of the conductive substrate comprises employing a physical vapour deposition or a chemical vapour deposition.

5. The method according to claim 4, wherein the physical vapour deposition or the chemical vapour deposition employs an organometallic or organic precursor.

6. The method according to claim 4, wherein the physical vapour deposition or chemical vapour deposition employs an inorganic precursor.

7. The method according to claim 1, further comprising forming a conductive overlay on the primary layer, wherein the forming of the conductive overlay comprises forming at least a portion of the conductive overlay to incorporate a dopant to lead to formation of a second secondary layer of correlated electron material between the primary layer and the conductive overlay.

8. A switching device comprising:
a primary layer of correlated electron material to be disposed over a conductive substrate and a conductive overlay to be disposed over the primary layer;
a first secondary layer of correlated electron material to be disposed between the primary layer and the conductive substrate; and
a second secondary layer of correlated electron material to be disposed between the primary layer and the conductive overlay,
wherein the conductive substrate and/or conductive overlay to comprise a metal or metal compound comprising titanium nitride, tantalum nitride or tungsten nitride or a combination thereof, and
wherein the primary layer comprises doped nickel oxide.

9. The switching device according to claim 8, wherein the doped nickel oxide to comprise a carbon-containing dopant or a nitrogen containing dopant, or a combination thereof.

10. A switching device comprising:
a primary layer of a correlated electron material to be disposed between a conductive substrate and a conductive overlay;
a first secondary layer of the correlated electron material to be disposed between the primary layer and the conductive substrate; and
a second secondary layer of correlated electron material to be disposed between the primary layer and the conductive overlay,
wherein the conductive substrate and/or conductive overlay to comprise a metal or metal compound comprising titanium nitride, tantalum nitride or tungsten nitride, or a combination thereof, and
wherein the first secondary layer and/or the second secondary layer to be free from unbound metal, the unbound metal to be in a zero oxidation state.

* * * * *